(12) United States Patent
Minamiura et al.

(10) Patent No.: US 6,759,832 B2
(45) Date of Patent: Jul. 6, 2004

(54) DEVICE FOR DETECTING A BATTERY CONDITION BASED ON VARIATIONS IN BATTER VOLTAGE

(75) Inventors: Keiichi Minamiura, Aichi (JP); Toshiaki Nakanishi, Aichi (JP)

(73) Assignees: Matsushita Electric Industrial Co., Ltd., Osaka (JP); Toyota Jidosha Kabushiki Kaisha, Aichi (JP)

( * ) Notice: Subject to any disclaimer, the term of this patent is extended or adjusted under 35 U.S.C. 154(b) by 0 days.

(21) Appl. No.: 10/250,203

(22) Filed: Jun. 12, 2003

(65) Prior Publication Data

US 2003/0178970 A1 Sep. 25, 2003

Related U.S. Application Data

(62) Division of application No. 10/243,382, filed on Sep. 13, 2002.

(30) Foreign Application Priority Data

Sep. 14, 2001 (JP) ........................................ 2001-280795
Sep. 3, 2002 (JP) ........................................ 2002-257559

(51) Int. Cl.[7] ................................................. H02J 7/16
(52) U.S. Cl. ...................................................... 320/150
(58) Field of Search ................................ 320/116, 119, 320/122, 134, 136, 150; 324/426, 433

(56) References Cited

U.S. PATENT DOCUMENTS 5,670,861 A 9/1997 Nor ............................. 320/118
6,278,257 B1 * 8/2001 Takada et al. ............... 320/116
6,486,637 B1 * 11/2002 Nakanishi et al. ........... 320/150
6,611,128 B2 * 8/2003 Minamiura et al. ......... 320/134

FOREIGN PATENT DOCUMENTS

| EP | 1 085 592 A2 | 3/2001 |
|---|---|---|
| EP | 1 096 636 A2 | 5/2001 |
| EP | 1 132 989 A2 | 9/2001 |
| JP | 09117072 | * 5/1997 |

OTHER PUBLICATIONS

Copy of European Search Report dated Nov. 10, 2003.

* cited by examiner

Primary Examiner—Pia Tibbits
(74) Attorney, Agent, or Firm—Snell & Wilmer, LLP

(57) ABSTRACT

In a battery control device for controlling input to and output from a battery pack of the present invention, the battery pack includes a plurality of serially-connected battery blocks each including a plurality of serially-connected unit batteries. The device includes: an internal resistance measurement section for each battery block; and a first malfunctioning battery detection section for detecting the unit battery as a leakage malfunctioning battery based on an internal resistance variation measured for each battery block during a prescribed time interval of a charging operation, wherein detection information about the leakage malfunctioning battery is reflected in the control of charging and discharging operations.

14 Claims, 6 Drawing Sheets

DEVICE FOR DETECTING A BATTERY CONDITION BASED ON VARIATIONS IN BATTER VOLTAGE

CROSS REFERENCE TO RELATED APPLICATIONS

This application is a Divisional Application of U.S. Ser. No. 10/243,382 filed Sep. 13, 2002 and entitled BATTERY CONTROL DEVICE, which application claims priority to Japanese Application Nos. 2001-280795 and 2002-257559, filed Sep. 14, 2001 and Sep. 3, 2002, respectively.

BACKGROUND OF INVENTION

1. Field of the Invention

The present invention relates to a battery control device for controlling charging and discharging operations with respect to battery packs including alkaline storage batteries and mounted on, for example, devices driven by battery packs, such as electric vehicles including automated guided vehicles.

2. Description of the Related Art

Conventionally, as a low-pollution vehicle designed for the purpose of solving environmental problems and energy problems, an electric vehicle such as a HEV (hybrid electric vehicle) and a PEV (pure electric vehicle) has received a great deal of attention. The electric vehicle has a battery pack, which includes alkaline storage batteries, mounted therein, and the electric power of the battery pack drives an electric motor so as to run the electric vehicle.

The electric vehicle includes an inverter for controlling motor drive and a battery control device for obtaining an output state of the battery pack and controlling charging and discharging operations with respect to the battery pack according to the output state of the battery pack, so as to stably supply the electric power to the electric motor via the inverter.

Such a conventional battery control device measures voltage and current output by the battery pack so as to calculate a remaining capacity SOC (State Of Charge; a value representing how much electric power remains in the battery pack) of the battery pack based on the measurement results. For example, the conventional battery control device controls the charge and discharge operations with respect to the battery pack so as to keep the remaining capacity SOC of the battery pack within a prescribed range. When the remaining capacity SOC falls below the prescribed range, the conventional battery control device performs a charging operation on the battery pack while inhibiting a discharging operation.

The battery pack as described herein includes a plurality of serially-connected battery blocks. In the casewhere the conventional battery control device charges the battery pack so as to keep the remaining capacity SOC of the battery pack within a prescribed range, when the plurality of battery blocks are uneven in remaining capacity SOC some battery blocks are forced to be overcharged. Alternatively, in some cases, the conventional battery control device periodically overcharges the entire battery pack so as to realize evenness in state of charge between the plurality of battery blocks.

However, in the conventional battery control device, when a minute crack and/or a minute pinhole are/is made in a single alkaline storage battery included in the battery pack through long-time use, such a minute crack and/or a minute pinhole cannot be easily detected. When an alkaline storage battery is overcharged, water in an electrolyte contained in a unit-battery case of the single alkaline storage battery is electrolyzed, so that hydrogen and oxygen gasses are generated. Further, when the hydrogen gas is emitted through the minute crack and/or the minute pinhole to the outside of the single alkaline storage battery, the amount of the emitted hydrogen gas is small and the hydrogen gas is diffused due to cooling air from a battery cooling fan, thereby making it difficult to detect the minute crack and/or the minute pinhole in a unit battery.

Furthermore, when the unit battery is left with the minute crack and/or the minute pinhole, battery deterioration is accelerated, thereby significantly reducing the reliability of the battery pack. Examples of the battery deterioration include a rise in internal resistance due to loss in moisture content of the electrolyte or due to carbon dioxide absorbed into the electrolyte, a decrease in remaining capacity SOC due to hydrogen emitted from the unit-battery case (in the case where nickel-metal hydride batteries are used in place of the alkaline storage batteries), erosion of a negative electrode, etc.

SUMMARY OF INVENTION

According to one aspect of the present invention, there is provided a battery control device for controlling input to and output from a battery pack, in which the battery pack includes a plurality of serially-connected battery blocks each including a plurality of serially-connected unit batteries, and the device includes: an internal resistance measurement section for each battery block; and a first malfunctioning battery detection section for detecting the unit battery as a leakage malfunctioning battery based on an internal resistance variation measured for each battery block during a prescribed time interval of a charging operation, wherein detection information about the leakage malfunctioning battery is reflected in the control of charging and discharging operations.

According to this structure, the first malfunctioning battery detection section detects a unit battery detection section detects a unit battery as a leakage malfunctioning battery based on internal resistance variation and detection information about the leakage malfunctioning battery is reflected in the control of the charge and discharge operations. Therefore, a battery block which includes a unit battery having a minute crack and/or a minute pinhole can be detected early enough, thereby preventing the reliability of a battery pack from being reduced.

In one embodiment of the invention, the first malfunctioning battery detection section determines that the unit battery is a leakage malfunctioning battery when a difference in internal resistance variation between the unit battery and a normal battery is greater than a constant obtained based on battery characteristics, and the internal resistance variation is an internal resistance difference, or a difference in internal resistance derivative value, measured during a prescribed time period.

According to this structure, a leakage malfunctioning battery can be precisely and readily detected.

According to another aspect of the present invention, there is provided a battery control device for controlling input to and output from a battery pack, in which the battery pack includes a plurality of serially-connected battery blocks each including a plurality of serially-connected unit batteries, and the device includes: a battery voltage measurement section for each battery block; and a second malfunctioning battery detection section for detecting the unit battery as a leakage malfunctioning battery based on a battery voltage variation measured for each battery block during a prescribed time interval of an overcharging operation, wherein detection information about the leakage malfunctioning battery is reflected in the control of charging and discharging operations.

According to this structure, the second malfunctioning battery detection section detects a unit battery as a leakage malfunctioning battery based on battery voltage variation and detection information about the leakage malfunctioning battery is reflected in the control of the charge and discharge operations. Therefore, a battery block which includes a unit battery having a minute crack and/or a minute pinhole can be detected early enough, thereby preventing the reliability of a battery pack from being reduced.

In one embodiment of the invention, the second malfunctioning battery detection section determines that the unit battery is a leakage malfunctioning battery when a difference in voltage variation between the unit battery and a normal battery is greater than a constant obtained based on battery characteristics, and the voltage variation is a voltage difference, or a difference in voltage derivative value, measured during a prescribed time period.

According to this structure, a leakage malfunctioning battery can be precisely and readily detected.

In one embodiment of the invention, the battery control device further includes a third malfunctioning battery detection section for detecting the unit battery as a leakage malfunctioning battery based on a battery temperature variation measured for each battery block during a prescribed time interval of the overcharging operation.

According to this structure, a unit battery is detected as a leakage malfunctioning battery based on both a battery internal resistance or battery voltage characteristic and a battery temperature characteristic, and therefore the leakage malfunctioning battery can be precisely detected. The detection of a leakage malfunctioning battery can be based only on the battery temperature characteristic. However, in such a case, it is necessary to provide a temperature sensor for each of a plurality of battery blocks. A battery voltage is measured for each battery block so as to be used in remaining capacity calculation, and therefore the battery voltage characteristic for use in the present invention can be readily obtained. Thus, it is desirable to detect the leakage malfunctioning battery based only on the battery internal resistance characteristic or the battery voltage characteristic, since the number of elements used in the battery controller can be reduced.

In one embodiment of the invention, the third malfunctioning battery detection section determines that the unit battery is a leakage malfunctioning battery when a difference in temperature variation between the unit battery and a normal battery is greater than a constant obtained based on battery characteristics, and the temperature variation is a temperature difference, or a difference in temperature derivative value, measured during a prescribed time period.

According to this structure, a leakage malfunctioning battery can be precisely and readily detected.

In one embodiment of the invention, the battery control device further includes a fourth malfunctioning battery detection section for detecting an internal resistance rise malfunctioning battery based on an internal resistance variation measured for each battery block during a prescribed time interval by measuring an internal resistance for each battery block during charging and discharging operations before or after detecting the leakage malfunctioning battery.

According to this structure, the abnormal battery detection section can detect abnormal batteries based on an open-circuit voltage difference measured during a prescribed time period so as to distinguish between the abnormal batteries and the other normal batteries, and therefore it is possible to readily detect a minor short-circuit malfunctioning battery, an internal resistance rise malfunctioning battery and a leakage malfunctioning battery.

In one embodiment of the invention, the battery control device further includes a fifth malfunctioning battery detection section for detecting a minor short-circuit malfunctioning battery based on reduction in battery voltage corresponding to a voltage of a single battery cell for each battery block during a charging operation before or after detecting the internal resistance rise malfunctioning battery.

According to this structure, a leakage malfunctioning battery can be precisely and readily detected.

In one embodiment of the invention, the battery control device further includes an abnormal battery detection section for detecting abnormal batteries based on a difference in open-circuit voltage measured during a prescribed time period before detecting at least any one of a minor short-circuit malfunctioning battery, an internal resistance rise malfunctioning battery and a leakage malfunctioning battery.

According to this structure, a unit battery having a minute crack and/or a minute pinhole is detected so as not to overcharge a battery block which includes the unit battery having a minute crack and/or a minute pinhole, and therefore water electrolysis is kept from occurring in that unit battery, thereby preventing the generation of hydrogen.

In one embodiment of the invention, the abnormal battery detection section determines that the unit battery is an abnormal battery when a difference in open-circuit voltage variation between the unit battery and a normal battery is greater than a constant obtained based on battery characteristics.

According to this structure, by providing, as an alarm, detection information about a unit battery as a malfunctioning battery by means display or sound immediately after the leakage malfunctioning battery is detected, a battery block which includes the unit battery having a minute crack and/or a minute pinhole can be detected early enough. By replacing the detected leakage malfunctioning battery with a normal battery, the reliability of the battery pack can be prevented from being reduced. Moreover, the detection information about the unit battery as a leakage malfunctioning battery can be stored in a storage section (internal memory) such that an informing section can obtain the detection information from the internal memory during a maintenance operation. By replacing the leakage malfunctioning battery with a normal battery in the maintenance operation, it is possible to ensure that the reliability of the battery pack is prevented from being reduced.

In one embodiment of the invention, the battery control device further includes an overcharge prohibition section for prohibiting a battery block including the unit battery as a leakage malfunctioning battery being overcharged during a charging operation.

In one embodiment of the invention, the battery control device further includes a storage section for storing detection information about the unit battery as a leakage malfunctioning battery such that an informing section can provide the detection information as an alarm.

Thus, the invention described herein makes possible the advantages of providing a battery control device for detecting a battery block, which includes a unit battery having a minute crack and/or a minute pinhole, early enough, so as to prevent the reliability of a battery pack from being reduced.

These and other advantages of the present invention will become apparent to those skilled in the art upon reading and understanding the following detailed description with reference to the accompanying figures.

DETAILED DESCRIPTION

Hereinafter, referring to the accompanying drawings, Embodiments 1 and 2 of the present invention are described with respect to the case where a battery control device according to the present invention is used in conjunction with a battery pack including a plurality of nickel-metal hydride batteries which is a power source for driving a HEV.

The term "battery block" described herein refers to a unit of batteries by which a voltage of the battery pack is measured, and a battery block includes a unit battery or a plurality of unit batteries. The term "unit battery" described herein refers to a battery including a case, a single cell accommodated in the case, and a pair of positive and negative terminals provided outside of the case, or a battery including a case, a plurality of cells accommodated in the case, and a pair of positive and negative terminals provided outside of the case. The term "leakage malfunctioning battery" described herein refers to a unit battery accommodated in a case having a minute crack and/or a minute pinhole, or a battery in which gas or an electrolyte leaks from the positive or negative terminal, a sealed portion, a safety valve attaching portion, etc.

Embodiment 1

Figure 1:
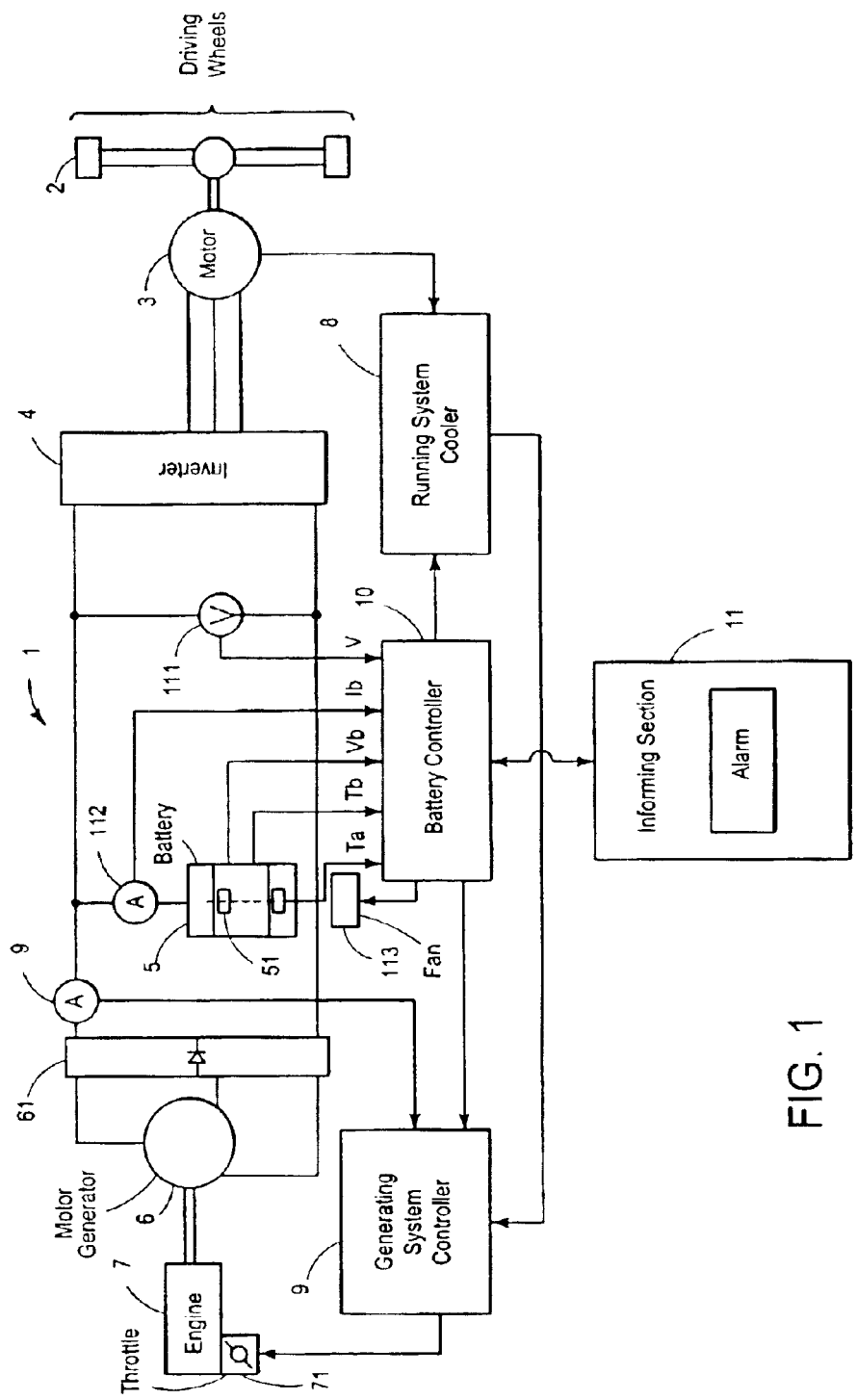
FIG. 1 is a block diagram showing a schematic structure of a HEV according to Embodiment 1 of the present invention.

FIG. 1 is a block diagram showing a schematic structure of a HEV 1 according to Embodiment 1 of the present invention. In FIG. 1, the HEV 1 includes: driving wheels 2; a motor 3 which is a power source for the driving wheels 2; an inverter 4 for supplying electric power to the motor 3; a battery pack 5 for supplying electric power to the inverter 4; a motor generator 6 for charging the battery pack 5 and supplying electric power to the inverter 4; an engine 7 for driving the motor generator 6; a running system controller 8 for controlling the driving of the inverter 4; a generating system controller 9 for controlling the driving of the engine 7; a battery controller 10 which is the battery control device of the present invention for controlling the driving of the running system controller B and the generating system controller 9; and an informing section 11 capable of providing, as an alarm, detection information about a malfunctioning battery block in the battery pack 5.

The driving wheels 2 are front wheels and/or rear wheels for moving the body of the HEV 1, and the power is actually transmitted to the driving wheels 2.

The motor 3 has an electromotive function of rotationally driving the driving wheels 2 when being supplied with electric power by at least either the motor generator 6 or the battery pack 5 at the time of starting or accelerating the HEV 1 and a power generation function for performing power regeneration at the time of slowing down or braking the HEV 1 so as to charge the battery pack 5.

The inverter 4 converts a voltage applied by the battery pack 5 into a prescribed three-phase high voltage so as to supply electric power to the motor 3, thereby rotationally driving the motor 3.

The battery pack 5 includes a plurality of serially-connected modules each comprising, for example, six battery cells (such as nickel-metal hydride batteries or the like) sealed in a unit-battery case. In FIG. 1, a battery block 51 can be formed of two modules which are used as a unit of battery voltage measurement. A value of an output voltage of each battery block 51 is, for example, DC 15 V, and the maximum value of an output voltage of the entire battery pack 5 including a plurality of the battery blocks 51 is about DC 300 V.

The motor generator 6 is a dynamo for supplying the electric power to the battery pack 5 via a rectifier 61 so as to charge the battery pack 5 and for supplying the electric power to the inverter 4.

The engine 7 is an internal combustion engine, such as a gasoline engine or a diesel engine. The amount of electric power generated by the engine 7 is controlled by a throttle 71 which controls the amount of fuel supplied to the engine 7 so as to control the rotation of the motor generator 6.

The running system controller 8 receives a control signal from a battery controller 10 while receiving feedback information about the state of rotation of the motor 3 so as to control the driving of the inverter 4, thereby stably controlling the running speed of the HEV 1 via the motor 3.

The generating system controller 9 receives a control signal from the battery controller 10 while receiving feedback information about a generated current value detected by a current measurement device 91 so as to control the rotation force of the engine 7 via the throttle 71 for controlling the amount of fuel to be supplied, thereby controlling the amount of current generated by the motor generator 6.

Figure 2:
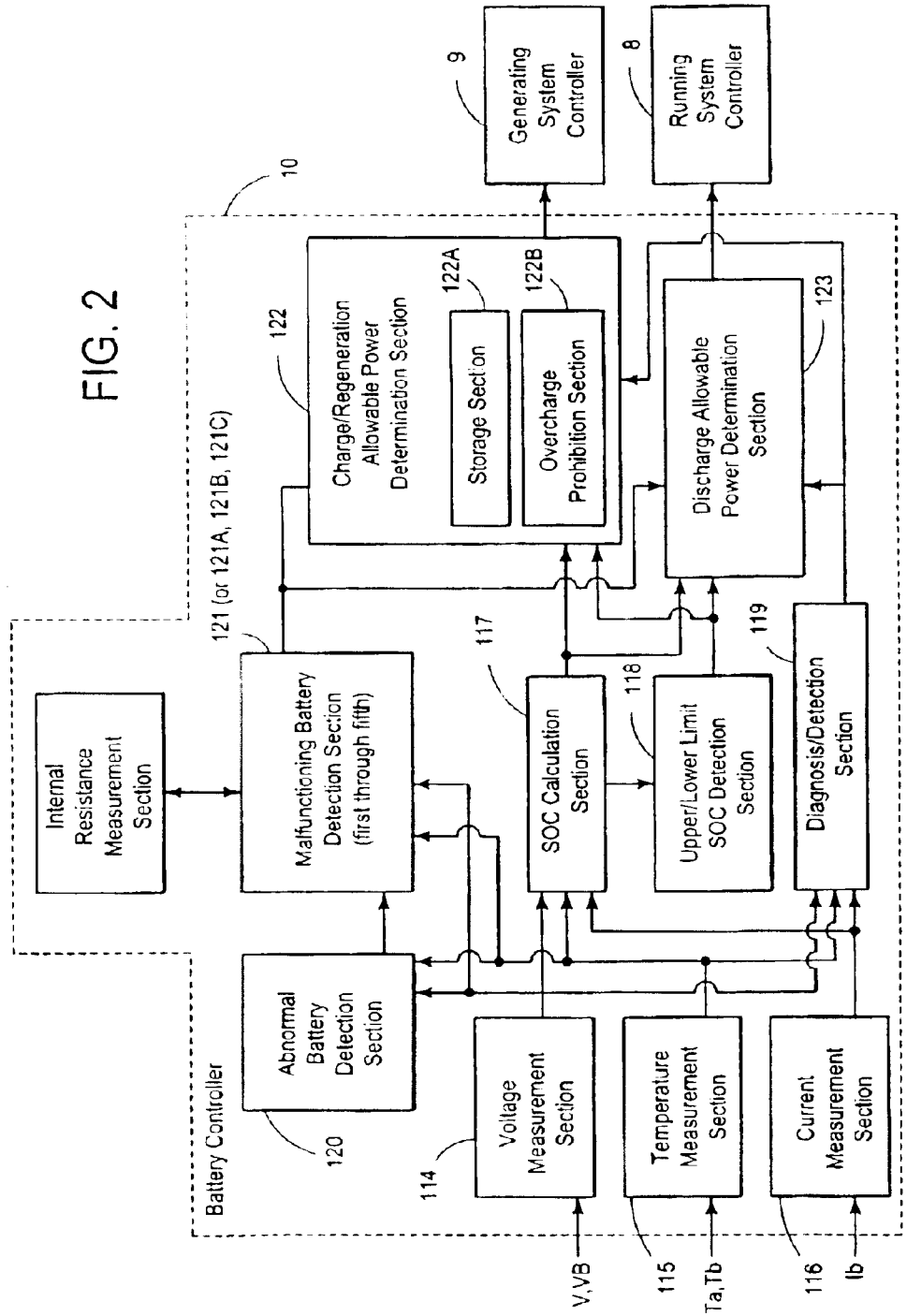
FIG. 2 is a block diagram showing a detailed structure of a battery controller shown in FIG. 1.

As shown in FIG. 2, the battery controller 10 includes: a voltage measurement section 114; a temperature measurement section 115; a current measurement section 116; a SOC calculation section 117; an upper/lower limit SOC detection section 116; a diagnosis/detection section 119; an abnormal battery detection section 120; a malfunctioning battery detection section 121; a charge/regeneration allowable power determination section 122; and a discharge allowable power determination section 123. The battery controller 10 receives information about battery pack temperatures Ta and Tb, a battery pack output voltage V detected by a voltage measurement device 111 (FIG. 1), an output voltage Vb detected for each battery block 51, and a battery pack output current Ib detected by a current measurement device 112 (FIG. 1) so as to calculate the state of charge of the battery pack 5 as the remaining capacity SOC (%). The battery controller 10 controls charge and discharge operations performed on the battery pack 5 via the running system controller 8 and the generating system controller 9 according to the calculated remaining capacity SOC while driving a fan 113 (FIG. 1) according to the detected battery temperatures Ta and Tb so as to cool the battery pack 5. As a characteristic of the present invention, the battery controller 10 detects a battery block including a unit battery having a minute crack and/or a minute pinhole and controls the detected battery block so as not to be overcharged.

The voltage measurement section 114 measures a battery block voltage Vb for each battery block 51 while measuring a voltage V of the entire battery pack 5 based on a voltage value detected by the voltage measurement device 111.

The temperature measurement section 115 measures a battery pack ambient temperature Ta variable due to heat generated by the battery pack 5, a battery block temperature Tb measured for each battery block 51, and a temperature of a cooling medium (not shown) based on the respective values detected by temperature sensors (not shown) provided at a plurality of locations, such as the periphery of the battery pack 5, the battery blocks 51, the cooling medium, etc.

The current measurement section 116 measures a battery pack output current Ib provided by the battery pack 5 based on a current value detected by the magnetic compensation-type (or shunt resistance-type) current measurement device 112.

The SOC calculation section 117 calculates the remaining capacity SOC for each battery block 51 and the remaining capacity SOC of the entire battery pack 5 based on information about a voltage of each battery block 51 and a voltage of the entire battery pack 5, which are measured by the voltage measurement section 114, a temperature Tb of each battery block 51 and a battery pack ambient temperature Ta, which are measured by the temperature measurement section 115, and an output current of each battery block 51 measured by the current measurement section 116.

The upper/lower limit SOC determination section 118 outputs an upper/lower limit SOC determination signal which represents that the remaining capacity SOC currently obtained by the SOC calculation section 117 has reached an upper/lower limit SOC value. The upper/lower limit SOC value refers to an upper/lower limit value within a prescribed intermediate region of the remaining capacity SOC in which the remaining capacity SOC is controlled by performing charging and discharging operations on the battery pack 5. Further, a SOC induction target value is set in the middle of the prescribed intermediate region. This prescribed intermediate region is set for the purpose of leaving sufficient remaining capacity SOC in the battery pack 5 so as to satisfy power assist requirements when starting or running the electric vehicle while leaving sufficient space for the battery pack 5 to be charged so as to collect energy as efficiently as possible when slowing down or braking the electric vehicle.

The diagnosis/detection section 119 outputs a diagnosis/detection signal based on a battery block voltage Vb and a battery voltage V which are measured by the voltage measurement section 114, battery temperatures Ta and Tb measured at appropriate places by the temperature measurement section 115, and a battery output current Ib measured by the current measurement section 116. In general, means for performing diagnosis and detection (corresponding to the diagnosis/detection section 119) uses a control algorithm so as to allow a battery ECU (Electronic Control Unit) to diagnose abnormality in a battery pack or the control of a vehicle based on voltage, current, and temperatures of batteries.

The abnormal battery detection section 120 distinguishes an abnormal battery from the other batteries including normal batteries by determining a measured battery as an abnormal battery based on a battery voltage measured for each battery block by the voltage measurement section 114 when a difference between the normal battery and the measured battery with respect to open-circuit voltage variation in a prescribed time period is greater than a constant obtained based on battery characteristics. In this manner, the abnormal battery detection section 120 detects abnormal batteries including leakage malfunctioning batteries accommodated in their respective unit-battery cases having a minute crack and/or a minute pinhole, batteries in which there is a rise in internal resistance (hereinafter, referred to as the "internal resistance (rise) malfunctioning batteries"), and minor short-circuit malfunctioning batteries. It should be noted that the "measured battery" means a unit battery or a battery block which is measured with respect to its voltage, temperature, current, and/or the like and the "constant obtained based on battery characteristics" means a prescribed value which is set so as to reliably distinguish a normal battery from abnormal batteries.

Specifically, the abnormal battery detection section 120 measures an open-circuit voltage difference during a prescribed time period, for example, a period from the time an ignition switch IG of the HEV 1 was most recently turned off to the time the ignition switch IG of the HEV 1 was turned on. In the case where a battery which satisfies the following conditional expression 1 is determined as an abnormal battery, and when an open-circuit variation of a battery is equal to or more than a constant obtained based on battery characteristics, the battery is determined as a normal battery.

For example, in the case where a current value=0, conditional expression 1 is represented by:$|\{vno(o)-Vno(t)\}-\{Vfa(O)-Vfa(t)\}|>X$, where Vno denotes a normal battery voltage, Vfa denotes a measured battery voltage, 0 denotes the time immediately after the ignition switch IG of the HEV 1 is turned off, t denotes an uncontrolled time period from the time the ignition switch IG of the HEV 1 is turned off to the time the ignition switch IG of the HEV 1 is turned on, and X denotes a constant obtained based on battery characteristics.

Figure 3:
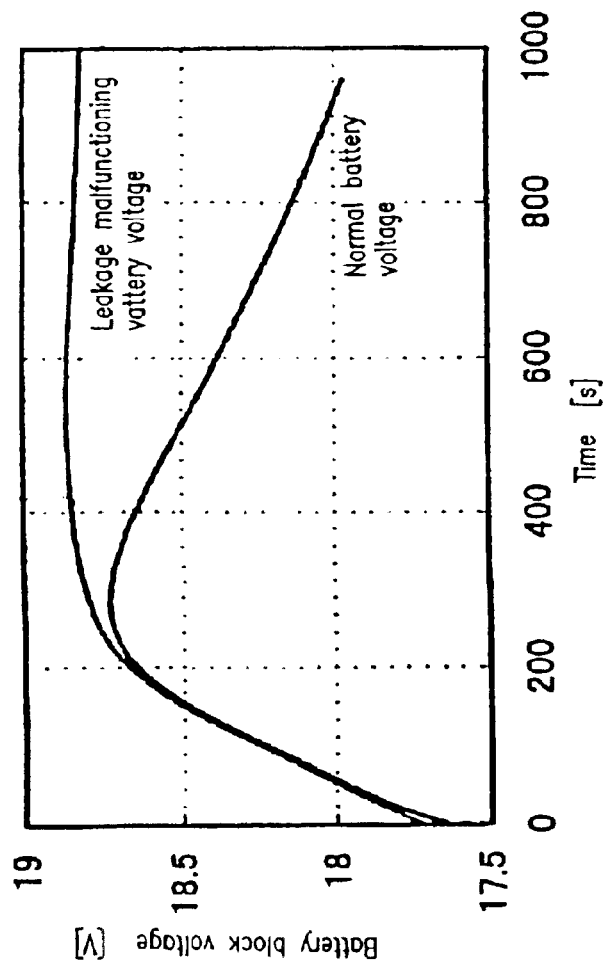
FIG. 3 is a graph showing battery voltage characteristics of a leakage malfunctioning battery and a normal battery during an overcharging operation.

Next, as shown in FIG. 3, in the case of overcharging the battery pack 5 at a constant current of 0.1 CA (C: capacity) or more, the malfunctioning battery detection section 121 utilizes the battery characteristic during an overcharging operation that a voltage of a normal battery is decreased with the passage of time (in units of seconds in the case shown in FIG. 3) and a voltage of a leakage malfunctioning battery accommodated in a unit-battery case having a minute crack and/or a minute pinhole is not considerably decreased so as to detect the leakage malfunctioning battery based on a voltage difference between the normal and leakage malfunctioning batteries.

Specifically, the malfunctioning battery detection section 121 detects a voltage difference between batteries during an overcharging operation based on a battery voltage measured for each battery block 51 provided by the voltage measurement section 114 so as to determine whether there is any leakage malfunctioning battery accommodated in a unit-battery case having a minute crack and/or a minute pinhole. In this case, a leakage malfunction battery satisfies the following conditional expression 2.

When a unit battery on which an overcharge operation is performed satisfies conditional expression 2 represented by $Y<|Vno-Vta|$, the unit battery is determined as a leakage malfunctioning battery.

When a unit battery on which an overcharge operation is performed satisfies $Y ≧ |Vno-Vfa|$, the unit battery is determined as a malfunctioning battery other than a leakage malfunctioning battery, or a normal battery.

In conditional expression 2, Vno denotes a difference between voltage levels of a normal battery measured before and after a prescribed time period, Vfa denotes a difference between voltage levels of a measured battery measured before and after the prescribed time period, and Y denotes a constant obtained based on battery characteristics.

In the case where any battery satisfying conditional expression 2 is detected, the malfunctioning battery detection section 121 outputs a diagnosis signal representing that the battery is determined as a leakage malfunctioning battery so as to distinguish the determination result from other possible battery determination results. It should be noted that the constant obtained based on battery characteristics denoted by Y means a prescribed value which is set so as to reliably distinguish a leakage malfunctioning battery from other abnormal batteries and normal batteries.

The charge/regeneration allowable electric power determination section 122 controls a charging operation performed on the battery pack 5 by outputting to a generating system controller 9 (e.g., see FIG. 2) an electric power determination control signal (a control signal) for determining charge/regeneration allowable electric power based on the remaining capacity SOC calculated by the SOC calculation section 117, an upper/lower limit SOC determination signal output by the upper/lower limit SOC determination section 118, a diagnosis/detection signal output by the diagnosis/detection section 119, and a detection signal output by the malfunctioning battery detection section 121.

The charge/regeneration allowable power determination section 122 includes a storage section 122A, which is an internal memory, and an overcharge prohibition section 122B. Upon the receipt of a signal representing that any leakage malfunctioning battery is detected, the charge/regeneration allowable power determination section 122 stores in the internal memory, for example, a battery block number as detection information representing that the leakage malfunctioning battery accommodated in a unit-battery case having a minute crack and/or a minute pinhole is detected. The charge/regeneration allowable power determination section 122 can output the detection information as alarm information when detecting a battery block having the stored battery block number or during a maintenance operation. The overcharge prohibition section 122B controls the charging operation on the leakage malfunctioning battery block having the stored battery block number so as not to overcharge the leakage malfunctioning battery block. The control for prohibiting the leakage malfunctioning battery block from being overcharged is performed so as to, for example, reduce a target remaining capacity value by a prescribed value, such that the leakage malfunctioning battery block is not fully charged.

The discharge allowable electric power determination section 123 controls a discharging operation performed on the battery pack 5 by outputting to a running system controller 8 an electric power determination control signal (a control signal) for determining discharge allowable electric power based on the remaining capacity SOC calculated by the SOC calculation section 117, the upper/lower limit SOC determination signal output by the upper/lower limit SOC determination section 118, the diagnosis/detection signal output by the diagnosis/detection section 119, and the detection signal output by the malfunctioning battery detection section 121. In particular, the discharge allowable electric power determination section 123 controls a discharging operation such that the amount of electric power discharged from the battery pack 5 does not exceed a prescribed value upon the receipt of the detection signal representing the presence of a malfunctioning battery.

The charge/regeneration allowable electric power determination section 122 and the discharge allowable electric power determination section 123 function together as a charge/discharge induction section. The charge/discharge induction section induces the battery pack 5 to be charged and discharged according to power assist requirements such that the calculated remaining capacity SOC is within the prescribed intermediate region.

The informing section 11 can provide, as an alarm, detection information about a unit battery as a malfunctioning battery by means of display or sound immediately after the leakage malfunctioning battery is detected. The detection information is stored in the internal memory of the charge/regeneration allowable power determination section 122 such that the informing section 11 can obtain the detection information about the leakage malfunctioning battery from the internal memory during the maintenance operation or the like, so that the leakage malfunctioning battery can be replaced with a normal battery when detecting the leakage malfunctioning battery or during the maintenance operation, thereby preventing the reliability of the battery pack 5 from being reduced.

The reason why a voltage of a normal battery is decreased more than that of a leakage malfunctioning battery during an overcharging operation, as shown in FIG. 3, is now described with respect to the case where a unit battery having a minute crack and/or a minute pinhole is a nickel-metal hydride battery.

In the case where a unit battery sealed in a single case is overcharged, hydrogen and oxygen gas is generated in the unit-battery case due to water electrolysis. These gases increase the internal pressure of the unit-battery case so that electrodes of the unit battery cause gas absorption reaction in the unit battery, whereby the gases are absorbed into an electrolyte in the unit battery. The gas absorption reaction is exothermic, and therefore a temperature of the unit battery is increased. When the battery temperature becomes high, the level of an overvoltage at which water electrolysis is caused in an electrolyte is decreased. Therefore, in the case where the unit battery sealed in a single case is overcharged, the battery voltage is decreased while the battery temperature is increased (see "1 voltage" of a normal battery shown in FIG. 4).

On the other hand, in the case where a unit battery accommodated in a single case having a minute crack and/or a minute pinhole is overcharged, although hydrogen and oxygen gas is generated in the unit-battery case due to water electrolysis, most of these gases are emitted through the minute crack and/or the minute pinhole to the outside of the single case of the unit battery, and therefore gas absorption reaction is not caused, whereby the battery temperature is not increased. Since the battery temperature is not substantially changed, the level of an overvoltage at which water electrolysis is caused in an electrolyte is not decreased. As a result, in the case where the unit battery accommodated in a single case having a minute crack and/or a minute pinhole is overcharged, the battery temperature is not increased, thereby causing no reduction in battery voltage (see "2 voltage" of a leakage malfunctioning battery shown in FIG. 4).

The operation of the above structure will now be described in detail.

Firstly, when the ignition switch IG of the HEV 1 is turned on so as to activate the control system, it is determined whether or not a voltage difference (open-circuit voltage variation) measured for each battery block 51 during a prescribed time period (a vehicle uncontrolled time period)

from the time the ignition switch IG was most recently turned off to the time the ignition switch IG was turned on is equal to or more than a prescribed value. In this case, the abnormal battery detection section 120 compares levels of an open-circuit voltage (OCV) measured for each battery block 51 before and after the vehicle uncontrolled time period so as to obtain a decrement of the OCV, so that it is possible to detect a battery block having a decrement of the OCV which is greater than a prescribed value or having a reduced absolute voltage, thereby detecting abnormal batteries including a leakage malfunctioning battery, a minor short-circuit battery, and an internal resistance malfunctioning battery. The reason why not only the leakage malfunctioning battery but also other abnormal batteries such as the minor short-circuit battery and the internal resistance malfunctioning battery are detected is that in the case of the leakage malfunctioning battery, during the vehicle uncontrolled time period in which the ignition switch IG remains in an "OFF" state, an electrolyte in a unit battery is decreased due to emission of hydrogen from a case of the unit battery, which causes significant deterioration of the unit battery, thereby reducing an OCV of the unit battery, and in the case of other abnormal batteries such as a battery simply draining liquid and a minor short-circuit battery caused by a short circuit between battery cells, during the vehicle uncontrolled time period, an OCV of an abnormal battery is slightly reduced, and therefore abnormal batteries including the leakage malfunctioning battery, the minor short-circuit battery, etc., are collectively detected.

Next, when the battery pack 5 is overcharged by running the HEV 1, the malfunctioning battery detection section 121 distinguishes leakage malfunctioning batteries from minor short-circuit malfunctioning batteries, etc., among the abnormal batteries detected by the abnormal battery detection section 120. In this overcharging operation, when a unit battery is different from a normal battery with respect to voltage variation and the difference in voltage variation is greater than a prescribed value, the malfunctioning battery detection section 121 determines that the unit battery is a leakage malfunctioning battery. On the other hand, when the difference in voltage variation is smaller than the prescribed value, the malfunctioning battery detection section 121 determines that the unit battery is a minor short-circuit malfunctioning battery or the like. The reason why the determination as described above is possible is, in addition to the above-described reason with reference to FIG. 4, that: due to a rise in internal resistance, a voltage of the leakage malfunctioning battery is increased during a charging operation, while the voltage of the leakage malfunctioning battery is decreased during a discharge operation; and due to a capacity reduction, a voltage of the minor short-circuit battery is decreased during a discharging operation, while the voltage of the minor short-circuit malfunctioning battery is not increased during a charging operation.

Further, upon the receipt of a signal representing that a leakage malfunctioning battery is detected, the charge/regeneration allowable power determination section 122 writes in the internal memory detection information about the leakage malfunctioning battery (e.g., a determination record, a block number, etc.), which is retained in the internal memory whether the power supply of the battery controller 10 is turned on or off.

Furthermore, when the a signal representing that a leakage malfunctioning battery is detected is input to each of the charge/regeneration allowable power determination section 122 and discharge allowable power determination section 123, the charge/regeneration allowable power determination section 122 and discharge allowable power determination section 123 limit inputs to and outputs from a battery block, which has a block number corresponding to a battery detected as a leakage malfunctioning battery, more than they limit inputs to and outputs from a battery block, which has a block number corresponding to a battery detected as a minor short-circuit battery or the like. Alternatively, input and output control over the battery block, which has a block number corresponding to a battery detected as a minor short-circuit battery or the like, is relaxed more than input and output control over the battery block, which has a block number corresponding to a battery detected as a leakage malfunctioning battery, are relaxed.

In Embodiment 1 of the present invention, the malfunctioning battery detection section 121 as a second malfunctioning battery detection section can be adapted to measure a battery voltage for each battery block while overcharging each battery block at a constant current of 0.1 CA or more, and in the case where a voltage difference of a normal battery measured during a prescribed time period is V1 and a voltage difference of a measured battery measured during the prescribed time period is V2, when |V1–V2| is greater than a constant obtained based on battery characteristics, the measured battery is determined as a leakage malfunctioning battery. However, the present invention is not limited to this, and the second malfunctioning battery detection section can be adapted to determine that the measured battery is a leakage malfunctioning battery when there is a difference in voltage variation (a difference in voltage derivative value) between a normal battery and the measured battery, which is greater than a constant obtained based on battery characteristics. Alternatively, in the case where the normal battery voltage variation rate per unit time after a prescribed time period is dV1/dt and the measured battery voltage variation rate per unit time after a prescribed time period is dV2/dt, the second malfunctioning battery detection section can be adapted to determine that the measured battery is a leakage malfunctioning battery when |dV1/dt–dV2/dt| is greater than a constant obtained based on battery characteristics. Detection precision achieved by the method for detecting a leakage malfunctioning battery using these variation rates (derivation values) is higher than that achieved by other detection methods described above.

Further, the malfunctioning battery detection section 121A, as a first malfunctioning battery detection section, uses an internal resistance measurement section (not shown) in conjunction with the voltage measurement section 114 and the current measurement section 116 so as to obtain an internal resistance for each battery block during a charging operation, such that a measured battery is determined as a leakage malfunctioning battery when a difference in internal resistance variation (internal resistance difference) between a normal battery and the measured battery is greater than a constant obtained based on battery characteristics. The first malfunctioning battery detection section 121A can measure an internal resistance for each battery block while charging each battery block at a constant current of 0.1 CA or more. In the case where a normal battery internal resistance measured after a prescribed time period is R1 and a measured battery internal resistance after the prescribed time period is R2, the first malfunctioning battery detection section 121A can determine that the measured battery is a leakage malfunctioning battery when |R1–R2| is greater than a constant obtained based on battery characteristics. However, the present invention is not limited to this, and the first malfunctioning battery detection section 121A can be adapted to determine that the measured battery is a leakage malfunctioning battery when a difference in internal resistance variation (a difference in internal resistance derivative value) between a normal battery and the measured battery is greater than a constant obtained based on battery characteristics. Alternatively, in the case where the normal battery internal resistance variation rate per unit time after a prescribed time period is dR1/dt and the measured battery internal resistance variation rate per unit time after the prescribed time period is dR2/dt, the first malfunctioning battery detection section 121A can be adapted to determine that the measured battery is a leakage malfunctioning battery when |dR1/dt–dR2/dt| is greater than a constant obtained based on battery characteristics. Detection precision achieved by the method for detecting a leakage malfunctioning battery using these variation rates (derivation values) is higher than that achieved by other detection methods described above.

Figure 4:
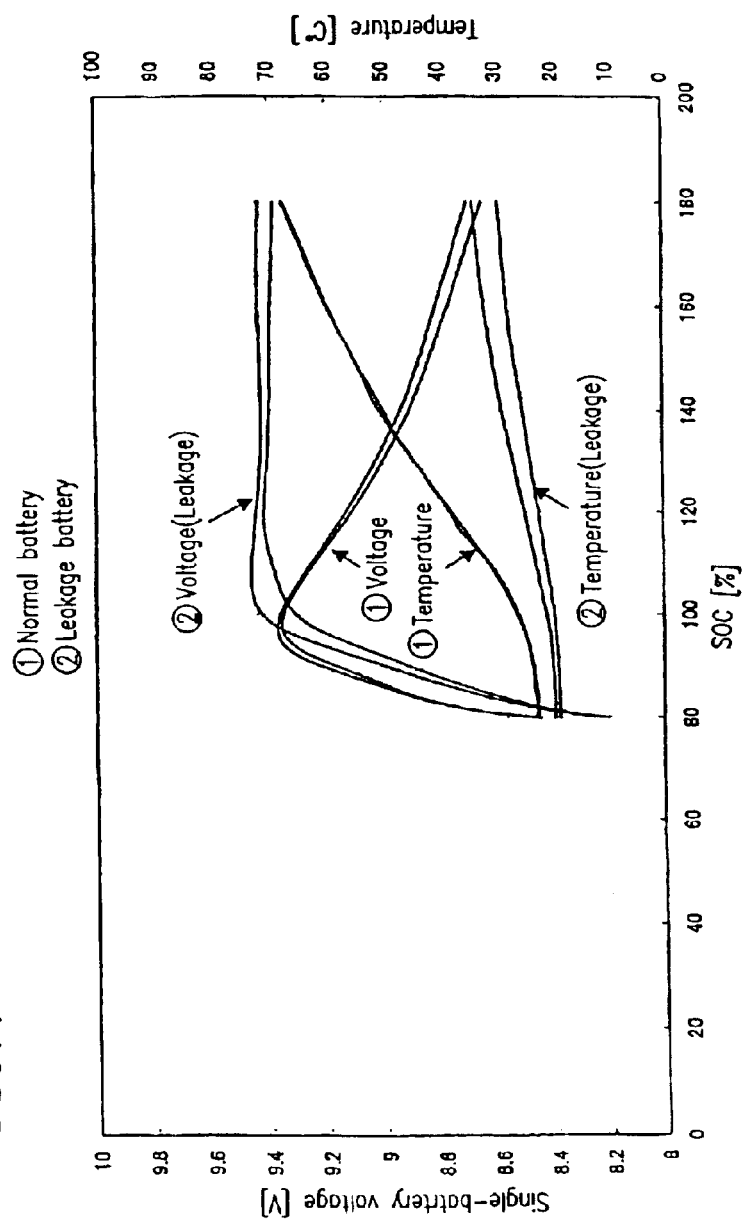
FIG. 4 is a graph showing battery voltage characteristics and battery temperature characteristics of a leakage malfunctioning battery and a normal battery during an overcharging operation.

Furthermore, the malfunctioning battery detection section 121B (FIG. 2) can be adapted to serve as a third malfunctioning battery detection section while serving as the first and/or second malfunctioning battery detection sections or simply to serve as the third malfunctioning battery detection section 121B. The third malfunctioning battery detection section 121B can detect a leakage malfunctioning battery based on a battery temperature variation, as shown in FIG. 4, measured for each battery block during a prescribed time interval of art overcharging operation. In this case, the third malfunctioning battery detection section 121B can determine that a measured battery is a leakage malfunctioning battery when a difference in temperature variation (temperature difference) between a normal battery and the measured battery is greater than a constant obtained based on battery characteristics. Specifically, the third malfunctioning battery detection section 121B can measure a battery temperature for each battery block while overcharging each battery block at a constant current of 0.1 CA more. In the case where a normal battery temperature after a prescribed time period is T1 and a measured battery temperature after a prescribed time period is T2, the third malfunctioning battery section 121B can determine that the measured battery is a leakage malfunctioning battery when |T1–T2| is greater than a constant obtained based on battery characteristics. However, the present invention is not limited to this, and the third malfunctioning battery detection section 121B can be adapted to determine that the measured battery is a leakage malfunctioning battery when a difference in temperature variation (a difference in temperature derivative value) in a prescribed time period between a normal battery and the measured battery is greater than a constant obtained based on battery characteristics. Alternatively, in the case where the normal battery temperature variation rate per unit time after a prescribed time period is dT1/dt and the measured battery temperature variation rate per unit time after the prescribed time period is dT2/dt, the third malfunctioning battery detection section 121B can be adapted to determine that the measured battery is a leakage malfunctioning battery when |dT1/dt–dT2/dt| is greater than a constant obtained based on battery characteristics. Detection precision achieved by the method for detecting a leakage malfunctioning battery using these variation rates (derivation values) is higher than other detection methods described above.

Embodiment 2

Embodiment 1 of the present invention has been described with respect to the case where a leakage malfunctioning battery is detected after detecting abnormal batteries based on an open-circuit voltage variation in a vehicle uncontrolled time period, while Embodiment 2 of the present invention will be described with respect to the case where normal batteries are detected as well as a leakage malfunctioning battery, an internal resistance rise malfunctioning battery and a minor short-circuit malfunctioning battery after detecting abnormal batteries. In the following description of Embodiment 2 of the present invention, elements having the same effects as those described in Embodiment 1 are denoted by the same reference numerals, and therefore the description thereof will be omitted.

A malfunction battery detection section 121C according to Embodiment 2 of the present invention includes a fourth malfunctioning battery detection section for detecting an internal resistance rise malfunctioning battery as well as a leakage malfunctioning battery after an abnormal battery detection process described in Embodiment 1 of the present invention, and a fifth malfunctioning battery detection section for detecting a minor short-circuit malfunctioning battery as well as a leakage malfunctioning battery after an abnormal battery detection process described in Embodiment 1 of the present invention. In this case, an abnormal battery detection section 120 detects abnormal batteries based on a difference in open-circuit voltage measured during a prescribed time period before detecting a leakage malfunctioning battery, an internal resistance rise malfunctioning battery, and a minor short-circuit malfunctioning battery.

The fourth malfunctioning battery detection section detects an internal resistance rise malfunctioning battery based on an internal resistance variation measured for each battery block during a prescribed time interval by measuring an internal resistance for each battery block during charging and discharging operations before (or after) detecting the leakage malfunctioning battery.

The fifth malfunctioning battery detection section detects a minor short-circuit malfunctioning battery based on reduction in battery voltage corresponding to a voltage of a single battery cell for each battery block during a charging operation before (or after) detecting the internal resistance rise malfunctioning battery.

The operation of the above structure will now be described in detail with reference to FIG. 5.

Figure 5:
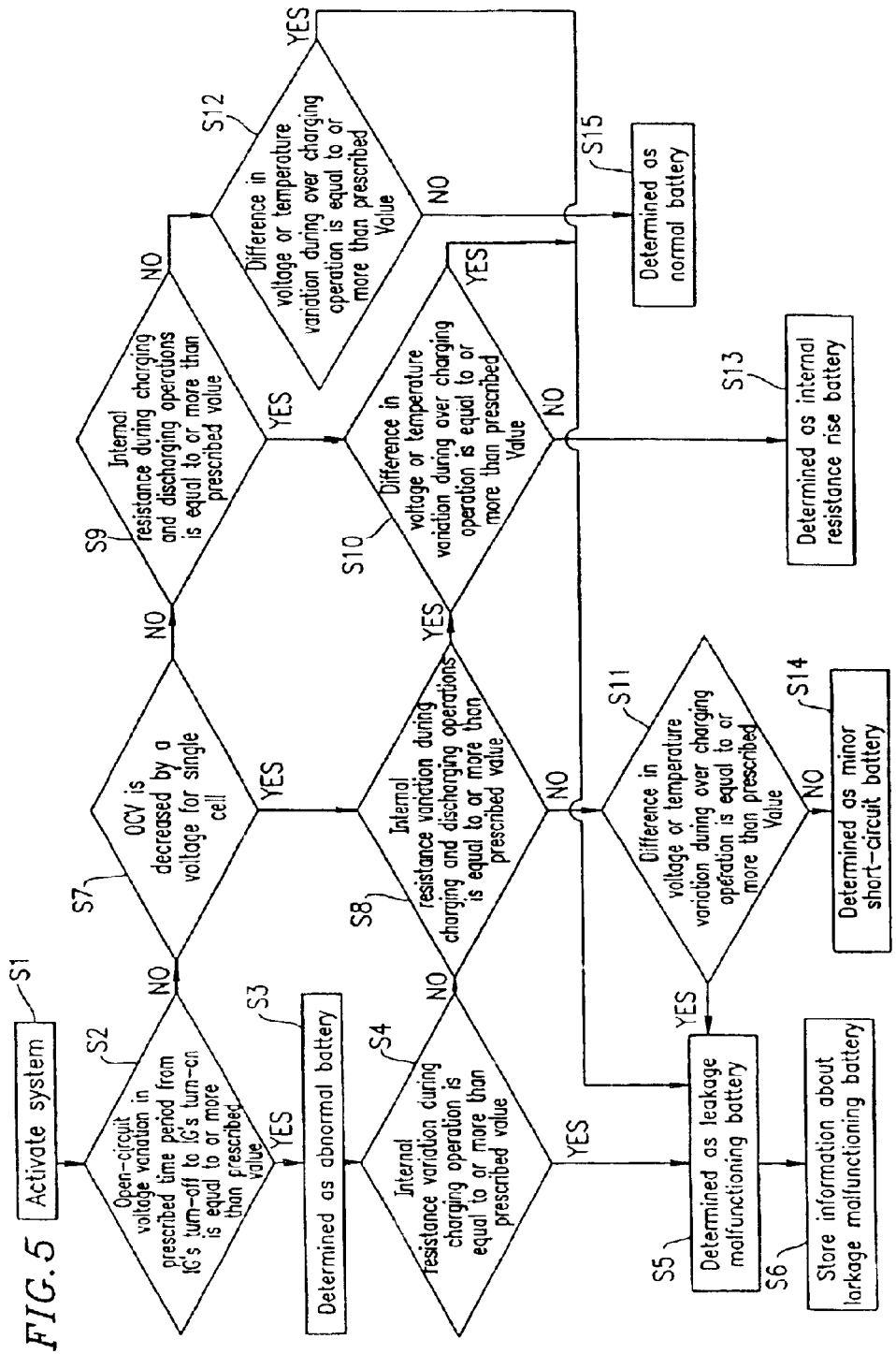
FIG. 5 is a flowchart explaining the operation of a battery controller of a HEV according to Embodiment 2 of the present invention.
Figure 6A:
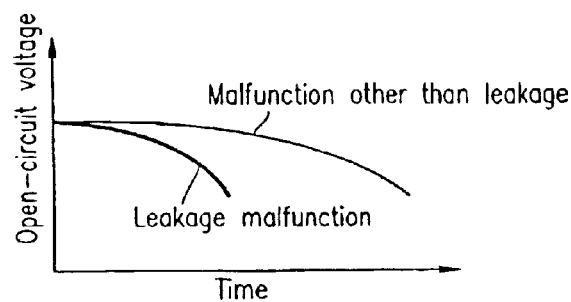
FIG. 6A is a graph showing a relationship between time and a battery open-circuit voltage.

Firstly, at step S1 in FIG. 5, an ignition switch IG of a HEV 1 (FIG. 1) is turned on so as to activate the control system. After the control system is activated, at step S2, it is determined whether or not a voltage difference (open-circuit voltage variation) measured for each battery block 51 (FIG. 1) during a prescribed time period (a vehicle uncontrolled time period) from the time the ignition switch IG was most recently turned off to the time the ignition switch IG was turned on is equal to or more than a prescribed value. In the case of the leakage malfunctioning battery, as shown in FIG. 6A, during the vehicle uncontrolled time period, the leakage malfunctioning battery is significantly deteriorated due to a decrease in amount of an electrolyte, thereby reducing an OCV of the leakage malfunctioning battery. In the case of other abnormal batteries such as a battery simply draining liquid and a minor short-circuit battery caused by a short circuit between battery cells, during the vehicle uncontrolled time period, as shown in FIG. 6A, an OCV of an abnormal battery is slightly reduced. Therefore, abnormal batteries including the leakage malfunctioning battery, the minor short-circuit battery, etc., are collectively detected. Accordingly, when it is determined that a voltage difference measured for each battery block 51 in the vehicle uncontrolled time period is to or more than a prescribed value at step S2, a minor short-circuit and the like is determined as the existence of abnormal batteries together with a leakage malfunctioning battery at step S3.

Figure 6B:
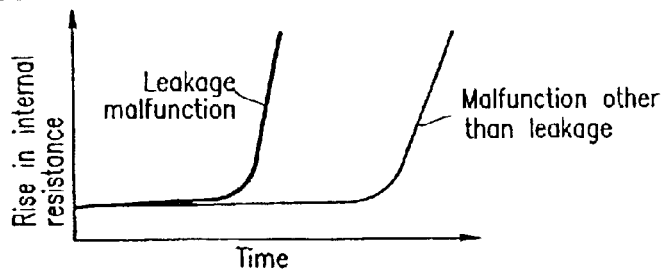
FIG. 6B is a graph showing a relationship between time and internal resistance.

At step S4, it is determined whether or not an internal resistance variation for each battery block is equal to or more than a prescribed value during a charging operation which starts when the idling of the engine 7 (FIG. 1) is begun by the system activation. In the case of the leakage malfunctioning battery, as shown in FIG. 6B, during the vehicle uncontrolled time period in which the ignition switch IG remains in an "off" state, the leakage malfunctioning battery is significantly deteriorated due to a decrease in the amount of electrolyte, thereby increasing internal resistance of the leakage malfunctioning battery at an early stage of the idling.

When the internal resistance variation of a measured battery in the prescribed time period is equal to or more than the prescribed value at step S4, the measured battery is determined as a leakage malfunctioning battery at step S5. Further, at step S6, information about the leakage malfunctioning battery (e.g., a battery block number, etc.) stored in a storage section (i.e. an internal memory).

On the other hand, when the voltage difference measured for each battery block 51 in the prescribed uncontrolled time period is not determined to be equal to or more than a prescribed value at step S2, it is determined, at step S7, whether or not an OCV measured for each battery block 51 before and after the prescribed uncontrolled time period varies so as to be decreased by a voltage corresponding to a single battery cell. Even a single short-circuited battery cell can cause a minor short-circuit battery, and therefore even in the case where an open-circuit voltage difference of a measured battery is smaller than a prescribed value, when the OCV of the measured battery is decreased by a voltage corresponding to a single battery cell after the prescribed time period, the possibility that the measured battery might be a minor short-circuit battery is high.

When the OCV of a measured battery is determined to be decreased by a voltage corresponding to a single battery cell at step S7, the process can jump to step S14 so as to conclude that a minor short-circuit battery has been detected. However, in this embodiment, the possibility of the minor short-circuit battery is simply determined to be high, and the process proceeds to step S8. Further, when the internal resistance variation of a measured battery is not determined to be equal to or more than the prescribed value at step S4, the measured battery is determined as a battery simply draining liquid or a minor short-circuit battery and the process proceeds to step S8.

Next, the HEV 1 is started running. The remaining capacity SOC of the battery pack 5 is controlled by the charge/regeneration allowable power determination section 122 and the discharge power allowable power determination section 123. When the remaining capacity SOC of the battery pack 5 of the currently running HEV 1 is gradually reduced by providing running power assist and reaches its lower limit, information that the remaining capacity SOC has reached its lower limit is input via the SOC calculation section 117 to the charge/regeneration allowable power determination section 122 and the discharge power allowable power determination section 123. The charge/regeneration allowable power determination section 122 controls a charging operation of the motor generator 6 performed on the battery pack 5. In this case, the HEV 1 is allowed to run by being supplied with electric power which is generated by the motor generator 6 and is discharged from the battery pack 5, while the control for limiting the running power assist is performed.

In these charging and discharging operations, there are some cases where an internal resistance value of the entire battery pack 5 is gradually increased, and therefore it is determined whether or not the internal resistance variation for each battery block 51 is equal to or more than a prescribed value at step S8. In the charging and discharging operations, when the internal resistance variation of the measured battery is determined to be equal to or more than the prescribed value at step S8, it is determined that there is a high possibility that the measured battery is an internal resistance rise battery due to a drain on the battery liquid, and the process proceeds to step S10. Alternatively, when the internal resistance variation of a measured battery is not determined to be equal to or more than the prescribed value at step S8, it is determined that there is a high possibility that the measured battery is a minor short-circuit battery due to a short circuit between battery cells, and the process proceeds to step S11.

Alternatively, when the OCV of the measured battery is not determined to be decreased by a voltage corresponding to a single battery cell at step S7, the process proceeds to step S9 so as to determine whether or not the internal resistance variation for each battery block 51 is equal to or more than a prescribed value during the charging and discharging operations. In the charging and discharging operations, when the internal resistance variation of a measured battery is determined to be equal to or more than the prescribed value at step S9, it is determined that there is a high possibility that the measured battery is an internal resistance rise battery due to a drain on the battery liquid, and the process proceeds to step S10. Alternatively, when the internal resistance variation of a measured battery is not determined to be equal to or more than the prescribed value at step S9, it is determined that there is a high possibility that the measured battery is a normal battery, and the process proceeds to step S12.

Further, at step S10, in the same manner as in Embodiment 1, it is determined whether or not a difference in voltage or temperature variation between a measured battery and a normal battery during an overcharging operation is equal to or more than a prescribed value. When the difference in voltage or temperature variation between the measured battery and the normal battery during the overcharging operation is determined to be equal to or more than a prescribed value at step S10, the process returns to step S5 so as to determine that the measured battery is a leakage malfunctioning battery. Alternatively, when the difference in voltage or temperature variation between the measured battery and the normal battery during the overcharging operation is not determined to be equal to or more than a prescribed value at step S10, the process proceeds to step S13 so as to determine that the measured battery is an internal resistance rise malfunctioning battery.

Similarly, at step S11, it is determined whether or not a difference in voltage or temperature variation between a measured battery and a normal battery during an overcharging operation is equal to or more than a prescribed value. When the difference in voltage or temperature variation between the measured battery and the normal battery during an overcharging operation is determined to be equal to or more than a prescribed value at step S11, the process returns to step S5 so as to determine that the measured battery is a leakage malfunctioning battery. Alternatively, when the difference in voltage or temperature variation between the measured battery and the normal battery during the overcharging operation is not determined to be equal to or more than a prescribed value at step S11, the process proceeds to step S14 so as to determine that the measured battery is a minor short-circuit malfunctioning battery.

Similarly, at step S12, it is determined whether or not a difference in voltage or temperature variation between a measured battery and a normal battery during an overcharging operation is equal to or more than a prescribed value. When the difference in voltage or temperature variation between the measured battery and the normal battery during the overcharging operation is determined to be equal to or more than a prescribed value at step S12, the process returns to step S5 so as to determine that the measured battery is a leakage malfunctioning battery. Alternatively, when the difference in voltage or temperature variation between the measured battery and the normal battery during the overcharging operation is not determined to be equal to or more than a prescribed value at step S12, the process proceeds to step S15 so as to determine that the measured battery is a normal battery.

As described above, according to Embodiments 1 and 2 of the present invention, the malfunctioning battery detection section 121 determines that a measured battery is a leakage malfunctioning battery when a difference in voltage variation between the measured battery and a normal battery is greater than a constant obtained based on battery characteristics. By limiting input and output operations on a battery block which is determined to include a leakage malfunctioning battery more than a battery block which is determined to include an abnormal battery of the other type, it is possible to prevent an electrolyte-from leaking out of a unit-battery case of the leakage malfunctioning battery or preventing hydrogen gas from leaking out of the unit-battery case of the leakage malfunctioning battery during overcharging and overdischarging operations. Further, it is possible to prevent a battery temperature from being increased due to an abrupt rise in internal resistance and prevent the melting of separators between battery electrodes and the melting of unit-battery cases. Therefore, it is possible to detect the leakage malfunctioning battery early enough so as to prevent the reliability of the battery pack from being reduced. In this case, even if the ignition switch IG is turned off, the diagnosis/detection section 119 is not turned off.

As described above, according to the present invention, the first malfunctioning battery detection section detects, based on internal resistance variation, that a unit battery is a leakage malfunctioning battery, and reflects the detection information in the control of the charge and discharge operations, and therefore a battery block which includes a unit battery having a minute crack and/or a minute pinhole can be detected early enough, thereby preventing the reliability of a battery pack from being reduced.

Further, according to the present invention, a unit battery is determined as a leakage malfunctioning battery when a difference in internal resistance variation (internal resistance difference or a difference in internal resistance derivative value) between the unit battery and a normal battery is greater than a constant obtained based on battery characteristics, and therefore the leakage malfunctioning battery can be precisely and readily detected.

Furthermore, according to the present invention, the second malfunctioning battery detection section detects, based on battery voltage variation, that a unit battery is a leakage malfunctioning battery, and reflects the detection information in the control of the charge and discharge operations, and therefore a battery block which includes a unit battery having a minute crack and/or a minute pinhole can be detected early enough, thereby preventing the reliability of a battery pack from being reduced.

Further still, according to the present invention, a unit battery is determined as a leakage malfunctioning battery when a difference in battery voltage variation (voltage difference or a difference in voltage derivative value) between the unit battery and a normal battery is greater than a constant obtained based on battery characteristics, and therefore the leakage malfunctioning battery can be precisely and readily detected.

Further still, according to the present invention, a unit battery is detected as a leakage malfunctioning battery based on both battery voltage and battery temperature characteristics, and therefore the leakage malfunctioning battery can be precisely detected.

Further still, according to the present invention, a unit battery is determined as a leakage malfunctioning battery when a difference in temperature variation (temperature difference or a difference in temperature derivative value) between the unit battery and a normal battery is greater than a constant obtained based on battery characteristics, and therefore the leakage malfunctioning battery can be precisely and readily detected.

Further still, according to the present invention, the abnormal battery detection section can detect abnormal batteries based on an open-circuit voltage difference measured during a prescribed time period so as to distinguish between the abnormal batteries and the other normal batteries, and therefore it is possible to readily detect a minor short-circuit malfunctioning battery, an internal resistance rise malfunctioning battery and a leakage malfunctioning battery.

Further still, according to the present invention, a unit battery is determined as an abnormal battery when a difference in voltage variation between the unit battery and a normal battery is greater than a constant obtained based on battery characteristics, and therefore the abnormal battery can be precisely and readily detected.

Further still, according to the present invention, a unit battery (a unit-battery case) having a minute crack and/or a minute pinhole is detected so as not to overcharge a battery block which includes the unit battery having a minute crack and/or a minute pinhole, and therefore water electrolysis is kept from occurring in that unit battery, thereby preventing the generation of hydrogen.

Further still, according to the present invention, by providing, as an alarm, detection information about a unit battery as a malfunctioning battery by means of display or sound immediately after the leakage malfunctioning battery is detected, a battery block which includes the unit battery having a minute crack and/or a minute pinhole can be detected early enough. By replacing the detected leakage malfunctioning battery with a normal battery, the reliability of a battery pack can be prevented from being reduced. Moreover, the detection information about the unit battery as a leakage malfunctioning battery can be stored in a storage section (internal memory) such that an informing section can obtain the detection information from the internal memory during a maintenance operation. By replacing the leakage malfunctioning battery with a normal battery in the maintenance operation, it is possible to ensure that the reliability of the battery pack is prevented from being reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A battery control device for controlling input to and output from a battery pack, wherein the battery pack includes a plurality of serially-connected battery blocks each including a plurality of serially-connected unit batteries, the device comprising:

a battery voltage measurement section for each battery block;

a first malfunctioning battery detection section for detecting a unit battery as a leakage malfunctioning battery based on a battery voltage variation measured for each battery block during a prescribed time interval of an overcharging operation; and a control section for controlling charging and discharging operations as a function of detection information about the leakage malfunctioning battery.

2. A battery control device according to claim 1, wherein the first malfunctioning battery detection section determines that the unit battery is a leakage malfunctioning battery when a magnitude of a difference in voltage variation between the unit battery and a normal battery is greater than a first constant obtained based on battery characteristics, and the voltage variation is a voltage difference, or a difference in voltage derivative value, measured during a prescribed time period.

3. A battery control device according to claim 2, further comprising a second malfunctioning battery detection section for detecting the unit battery as a leakage malfunctioning battery based on a battery temperature variation measured for each battery block during a prescribed time interval of the overcharging operation.

4. A battery control device according to claim 3, wherein the second malfunctioning battery detection section determines that the unit battery is a leakage malfunctioning battery when a difference in temperature variation between the unit battery and a normal battery is greater than a second constant obtained based on battery characteristics, and the temperature variation is a temperature difference, or a difference in temperature derivative value, measured during a prescribed time period.

5. A battery control device according to claim 1, further comprising a second malfunctioning battery detection section for detecting the unit battery as a leakage malfunctioning battery based on a battery temperature variation measured for each battery block during a prescribed time interval of the overcharging operation.

6. A battery control device according to claim 5, wherein the second malfunctioning battery detection section determines that the unit battery is a leakage malfunctioning battery when a difference in temperature variation between the unit battery and a normal battery is greater than a constant obtained based on battery characteristics, and the temperature variation is a temperature difference, or a difference in temperature derivative value, measured during a prescribed time period.

7. A battery control device according to claim 1, further comprising a second malfunctioning battery detection section for detecting an internal resistance rise malfunctioning battery based on an internal resistance variation measured for each battery block during a prescribed time interval by measuring an internal resistance for each battery block during charging and discharging operations before or after detecting the leakage malfunctioning battery.

8. A battery control device according to claim 7, further comprising a third malfunctioning battery detection section for detecting a minor short-circuit malfunctioning battery based an reduction in battery voltage corresponding to a voltage of a single battery cell for each battery block during a charging operation before or after detecting the internal resistance rise malfunctioning battery.

9. A battery control device according to claim 8, further comprising an abnormal battery detection section for detecting abnormal batteries based on a difference in open-circuit voltage measured during a prescribed time period before detecting a minor short-circuit malfunctioning battery, an internal resistance rise malfunctioning battery and a leakage malfunctioning battery.

10. A battery control device according to claim 9, wherein the abnormal battery detection section determines that the unit battery is an abnormal battery when a difference in open-circuit voltage variation between the unit battery and a normal battery is greater than a constant obtained based on battery characteristics.

11. A battery control device according to claim 1, further comprising an abnormal battery detection section for detecting abnormal batteries based on a difference in open-circuit voltage measured during a prescribed time period before detecting a leakage malfunctioning battery.

12. A battery control device according to claim 11, wherein the abnormal battery detection section determines that the unit battery is an abnormal battery when a difference in open-circuit voltage variation between the unit battery and a normal battery is greater than a constant obtained based on battery characteristics.

13. A battery control device according to claim 1, further including an overcharge prohibition section for prohibiting a battery block including the unit battery as a leakage malfunctioning battery from being overcharged during a charging operation.

14. A battery control device according to claim 1, further including a storage section for storing detection information about the unit battery as a leakage malfunctioning battery such that an informing section can provide the detection information as an alarm.

* * * * *